United States Patent [19]

Gregorian et al.

[11] Patent Number: 4,541,103
[45] Date of Patent: Sep. 10, 1985

[54] DIGITALLY CONTROLLED SYLLABIC FILTER FOR A DELTA MODULATOR

[75] Inventors: Roubik Gregorian, Santa Clara; Glenn Wegner, San Jose, both of Calif.

[73] Assignee: American Microsystems, Inc., Santa Clara, Calif.

[21] Appl. No.: 468,608

[22] Filed: Feb. 22, 1983

[51] Int. Cl.³ .......................................... H04B 12/04
[52] U.S. Cl. .................................... 375/32; 332/11 D
[58] Field of Search ................. 332/11 D; 375/28, 30, 375/32; 333/173, 174; 340/347 DD

[56] References Cited

U.S. PATENT DOCUMENTS

| | | | |
|---|---|---|---|
| 3,784,922 | 1/1974 | Blahut | 375/32 |
| 3,857,111 | 12/1974 | Deschenes et al. | 332/11 D |
| 4,035,724 | 7/1977 | Stephenne et al. | 375/32 |
| 4,044,306 | 8/1977 | Villeret et al. | 340/347 DD |
| 4,411,002 | 10/1983 | Auger | 332/11 D |
| 4,438,523 | 3/1984 | Brandl | 375/32 |
| 4,446,565 | 5/1984 | Backof, Jr. | 332/11 D |

*Primary Examiner*—Benedict V. Safourek
*Attorney, Agent, or Firm*—Steven F. Caserza; Alan H. MacPherson; Kenneth E. Leeds

[57] ABSTRACT

A unique CVSD CODEC is provided utilizing switched capacitor technology. This CVSD CODEC includes a syllabic filter which provides one of a large number of possible step sizes, thereby allowing the CVSD CODEC to accurately track and convert a wide range of input voltages. The CVSD CODEC includes coincidence logic, which determines how accurately the input voltage is being tracked, and a syllabic filter which provides an appropriate step size based upon the output signals of the coincidence logic. Large step sizes are provided for converting input voltages having large magnitudes, and small step sizes are used to convert input voltages having small magnitudes, thereby providing the very accurate resolution of input voltages over the wide range of magnitudes, while minimizing the bit rate required.

6 Claims, 10 Drawing Figures

DIGITALLY CONTROLLED SYLLABIC FILTER FOR A DELTA MODULATOR

BACKGROUND OF THE INVENTION

1. Field of the Invention

This invention relates to syllabic filters suitable for use in controlling the step size in a continuously variable slope delta (CVSD) CODEC.

2. Description of the Prior Art

Analog-to-digital converters convert an analog signal, typically an analog voltage, into a digital signal. This necessarily requires quantizing the range of analog signal into a number of discrete voltage ranges. For example, in one system a binary system of 000 will be generated for all voltages ranging from 0 to 0.1 volts, a binary 001 signal will be generated for all voltages greater than 0.1 volt and not greater than 0.2 volts, etc.

In some applications, this technique of utilizing voltage steps of a fixed size over the entire range of input voltages is adequate. However, in many instances, in particular in the digital-to-analog and analog-to-digital conversion of speech signals, for example in the operation of a coder-decoder (CODEC), the use of a large step size will effectively preclude accurate conversion of low level signals, thereby providing unacceptable distortion of the signal. On the other hand, the use of a fixed step of small value, while preventing distortion of low level signals, results in a large number of discrete steps over the entire range of input signals, thereby requiring the digital word representing the analog signal to be rather large. The larger the word size, the greater the transmission rate required to transmit the digital representation of an analog signal.

In order to minimize the transmission rate and yet provide a high quality output signal with little distortion, compressor/expanders (companders) are used. It has been found that rather large step sizes may be used when converting speech signals lying in the middle and high end of the speech signal amplitude range without causing excessive distortion of the speech signal. Accordingly, it is highly desirable to utilize a digital-to-analog or analog-to-digital conversion technique which does not use a plurality of steps of equal size, but which uses small steps for the conversion of low level signals, and larger steps for the conversion of larger signals. One technique for doing this is called the continuously variable slope delta (CVSD) modulator, which provides a plurality of steps, each step being of a different size. The smallest step is used to convert low level signals (i.e., those signals having amplitudes near 0 volts), and the steps increase in size, with the largest step being used to convert the largest signals (i.e., those signals having amplitudes of ±Vref, where Vref is the magnitude of the reference voltage used in the CVSD modulator). This nonlinear digital to analog conversion effectively compresses the input analog signal amplitude range from 0 to ±Vref, as shown in FIG. 1. This compressed, digital signal is then transmitted to an expander, which converts the compressed digital signal to an expanded analog signal which is a good reproduction of the input analog signal.

One prior art circuit for generating the required step sizes used in a CVSD CODEC is shown in the block diagram of FIG. 2. The analog input signal Vin to be converted is applied to the noninverting input lead 11 of comparator 12. The output signal from comparator 12 is applied via lead 13 to coincidence logic 14. Coincidence logic 14 serves to detect when the output signal from comparator 12 has been continuously either high or low for a plurality of samples, thus indicating that the output signal generated by encoder filter 17 (which is fully described later) is not accurately following the input signal. The output signal from coincidence logic 14 is applied to syllabic filter 15. Syllabic filter 15 establishes the integrating voltage ("step size") used by encoder filter 17 used by the CODEC at any particular time during the analog-to-digital or digital-to-analog conversion process. Thus, if the output signal from encoder filter 17 does not "track" the input voltage fast enough, sylabbic filter 15 increases the step size. The output signals from comparator 12 and syllabic filter 15 are applied to polarity switch 16. Polarity switch 16 serves to provide either a positive or a negative voltage to encoder filter 17, depending on whether encoder filter must increase or decrease its output voltage in order to match the input signal Vin. The output signal from polarity switch 16 is applied to encoder filter 17, which serves to integrate the signals received from polarity switch 16 to provide an output signal which matches the input signal Vin. In turn, the output signal from encoder filter 17 is applied to the inverting input lead 18 of comparator 12. The delta modulated digital output signal representing the analog input signal applied to input terminal 11 is provided by the output signal bit stream from comparator 12 made available to other circuitry (not shown) on output terminal 21.

The companding action provided by the circuit of FIG. 2 improves the signal to noise performance of the CODEC, as compared with CODECs which utilize a fixed step size which is too great to accurately reproduce low level input signals Vin. The companding action provided by the circuit of FIG. 2 also decreases the bit rate which is required by delta modulators which utilize a fixed step size which is sufficiently small to allow proper reproduction of low level input signals Vin, but which is much smaller than the step size required to accurately reproduce large level input signals Vin.

One type of prior art syllabic filter 20 is shown in the schematic diagram of FIG. 3 together with one prior art circuit serving as coincidence logic 14. Coincidence logic 14 receives an input signal on input terminal 21 from comparator 12 (FIG. 2). This input signal is clocked into four bit shift register 22. When the output signals A0 through A3 provided by shift register 22 are all logical zeros or all logical ones, indicating that the output signal from encoder filter 17 (FIG. 2) has not tracked the input signal Vin and thus that the step size provided by syllabic filter 15 is too small, the output signal from OR gate 29 goes high, thereby connecting capacitor 26 to reference voltage Vref through resistor 25, thereby charging capacitor 26 and increasing the output voltage available on lead 27. This output voltage on lead 27 is applied to encoder filter 17 (FIG. 2), thereby increasing the step size. Conversely, when the step size is too large, the output signal from comparator 12 (FIG. 2) toggles between one and zero and the output signals A0 through A3 provided by shift register 22 are not all logical ones or zeros which cause the output signal from OR gate 29 to go low, thereby discharging capacitor 26 through resistor 25, thereby decreasing the voltage available on output terminal 27. This discrease in output voltage on terminal 27 causes the step size to decrease, providing more accurate conversion of the input signal. However, such a prior art syllabic filter 20 utilizing shift register 22 as coincidence logic has not proven adequate to provide sufficiently low distortion due to poor control of the step size.

In the prior art, syllabic filter 15 has been satisfactorily realized in discrete form by cascading two very low frequency single pole sections, as shown in the schematic diagram of FIG. 4. However, it is highly desirable to fabricate CODECs in integrated circuit form, thereby achieving substantial cost and size reductions over CODECs formed from discrete components. Metal oxide silicon (MOS) technology is especially useful to form very large integrated circuits, typically containing as many as five thousand transistors to form a complex circuit of which a CODEC is only a part. However, in MOS technology, resistor values, capacitor values, and resistor ratios are not highly controllable. The syllabic filter shown on the schematic diagram of FIG. 4 relies on the absolute values of resistors 35 and 37, and 39 and 41, and capacitors 38 and 42 to define the operating characteristics (such as time constants) of the syllabic filter. In order to overcome the problems associated with highly uncontrollable resistor and capacitor absolute values in MOS technology, switched capacitor resistor equivalent technology has been developed, as described in an article by Allstop, et al., entitled "MOS Switched Capacitor Ladder Filters", IEEE Journal of Solid-State Circuits, Volume SC-13, No. 6, December, 1978, pages 806 to 814, which is hereby incorporated by reference. Switched capacitor resistor equivalent technology utilizes a capacitor and appropriate switches to form a resistor equivalent. Because in MOS circuits the thickness of dielectrics are rather constant over the surface of the device, and the size of capacitor plate areas is highly controllable, ratios of capacitances are highly controllable. Thus, the use of switched capacitor resistor equivalent technology allows the highly uncontrollable RC time constants realized by capacitors and resistors to be replaced by highly controllable time constants realized by capacitor ratios.

However, implementation of the syllabic filter of FIG. 4 as an MOS integrated circuit utilizing switched capacitor technology provides very poor performance due to the very long time constants involved. Due to the very long time constants, the capacitance value of the capacitors used to form switched capacitor feedback resistors 37 and 41 become very small causing very small amount of DC feedback, which in turn results in a large DC offset voltage due to clock feedthrough and operational amplifier DC offset voltage. For proper performance the step-size should be controlled very accurately and the DC offset component of the output signal of syllabic filter 15 must be less than one millivolt. DC offset voltages are caused by undesirable feedthrough of clock signals and offset voltages inherent in all operational amplifiers due to finite component mismatches. When implementing the syllabic filter of FIG. 4 using switched capacitor resistor equivalents, an offset voltage of approximately 100 millivolts was realized, thereby precluding use of this type of syllabic filter utilizing switched capacitor technology.

SUMMARY

In accordance with this invention, a unique CVSD CODEC is provided utilizing switched capacitor technology. This CVSD CODEC includes a syllabic filter which provides one of a large number of possible step sizes, thereby allowing the CVSD CODEC of this invention to accurately track and convert a wide range of input voltages. The CVSD CODEC of this invention includes coincidence logic, which determines how accurately the input voltage is being tracked, and a syllabic filter which provides an appropriate step size based upon the output signals of the coincidence logic. Large step sizes are provided for converting input voltages having large magnitudes, and small step sizes are used to convert input voltages having small magnitudes, thereby providing the very accurate resolution of input voltages over the wide range of magnitudes, while minimizing the bit rate required.

DETAILED DESCRIPTION

Figure 5:
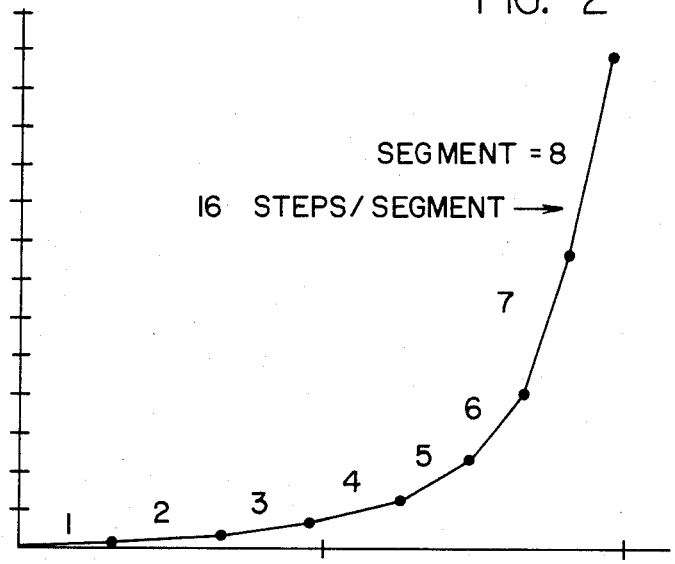
FIG. 5 is a diagram showing the 128 step sizes of one embodiment of this invention.
Figure 1:
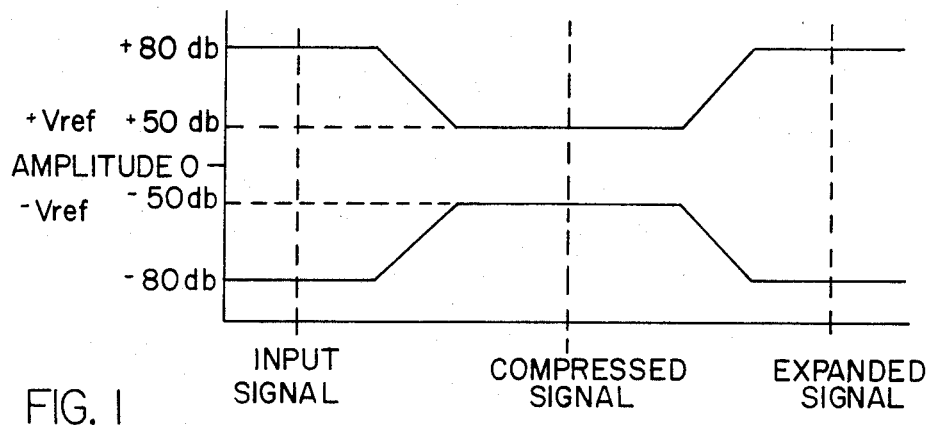
FIG. 1 is a graphical representation of the companding action of the CVSD CODEC constructed in accordance with this invention.
Figure 3:
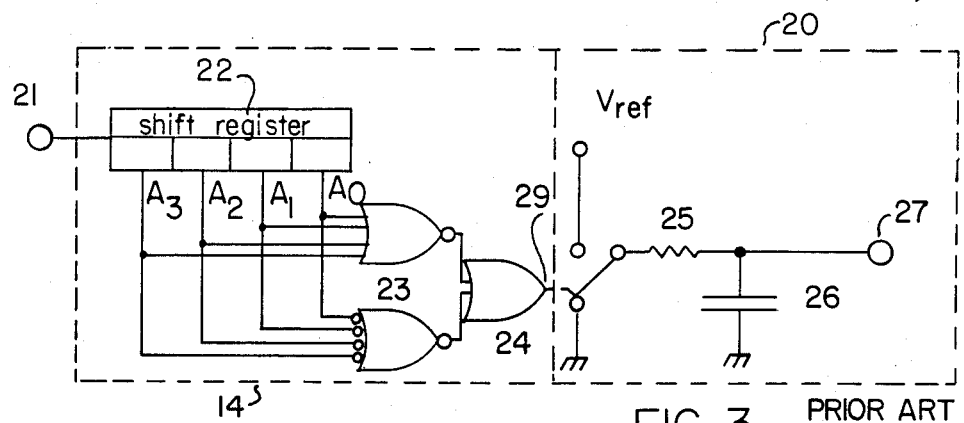
FIG. 3 is a schematic diagram with a prior art syllabic filter.
Figure 4:
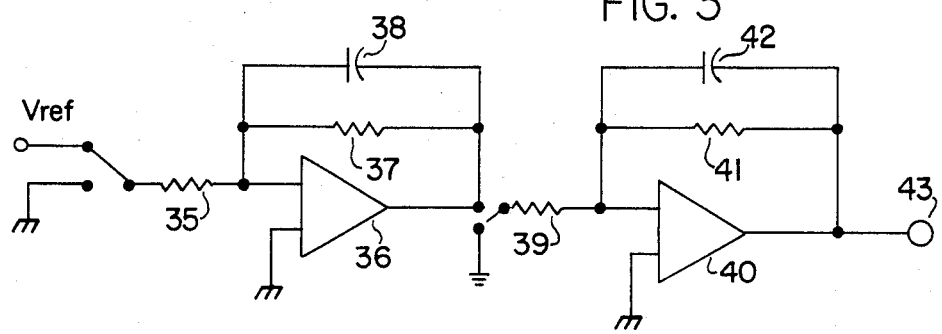
FIG. 4 is a schematic diagram of another prior art syllabic filter.

In accordance with this invention, a syllabic filter 15 (FIG. 2) is provided which, at any given time, generates a desired one of a plurality of possible step sizes, thereby allowing the output voltage of the encoder filter 17 to track the input voltage Vin applied to the CVSD modulator as accurately and as quickly as possible. FIG. 5 depicts the plurality of step sizes in one embodiment of this invention. As shown in the graphical representation of FIG. 5, the range of step sizes provided by syllabic filter 15 (FIG. 2) is provided in a plurality of eight "segments", each segment providing a plurality of 16 step sizes. Accordingly, in this embodiment of my invention, a total of 128 step sizes are available.

Figure 2:
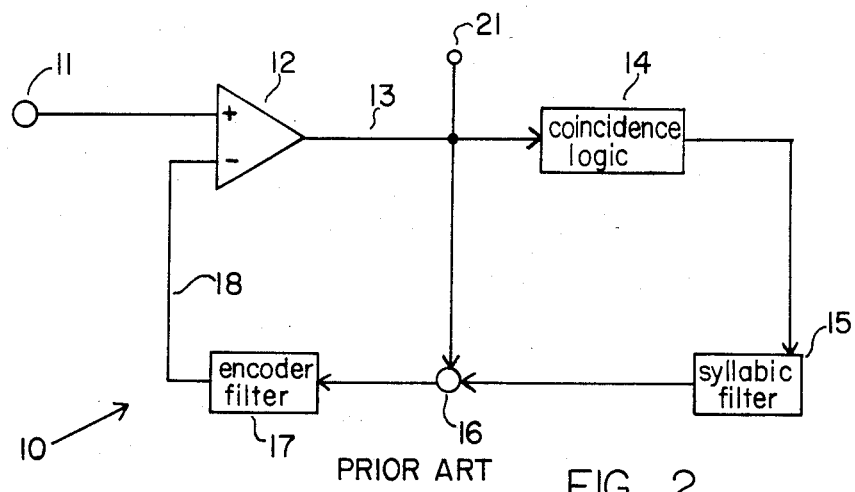
FIG. 2 is a block diagram of a CVSD CODEC.
Figure 6:
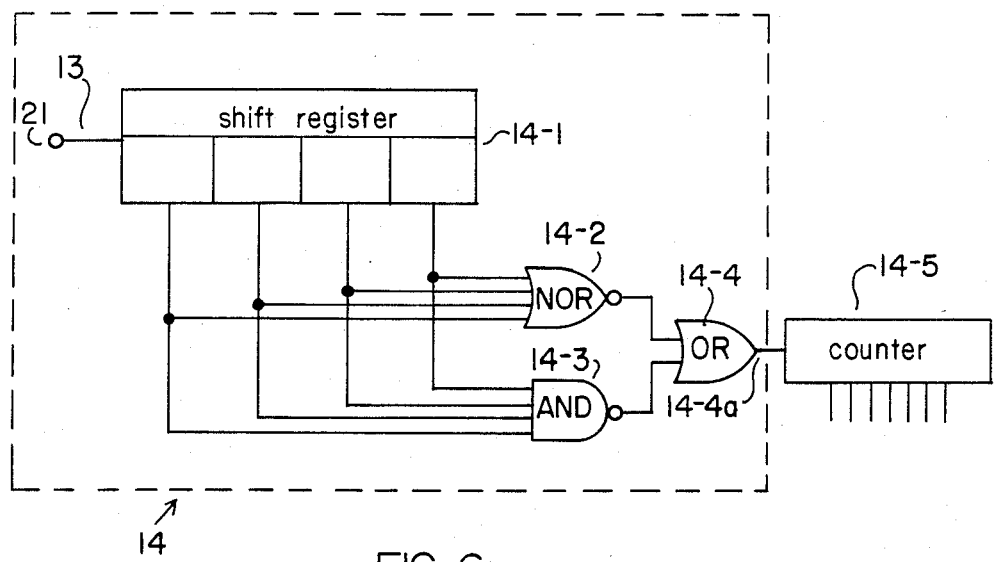
FIG. 6 is a schematic diagram of one embodiment of the coincidence logic used in accordance with this invention.
Figures 7, 7A, 7B:
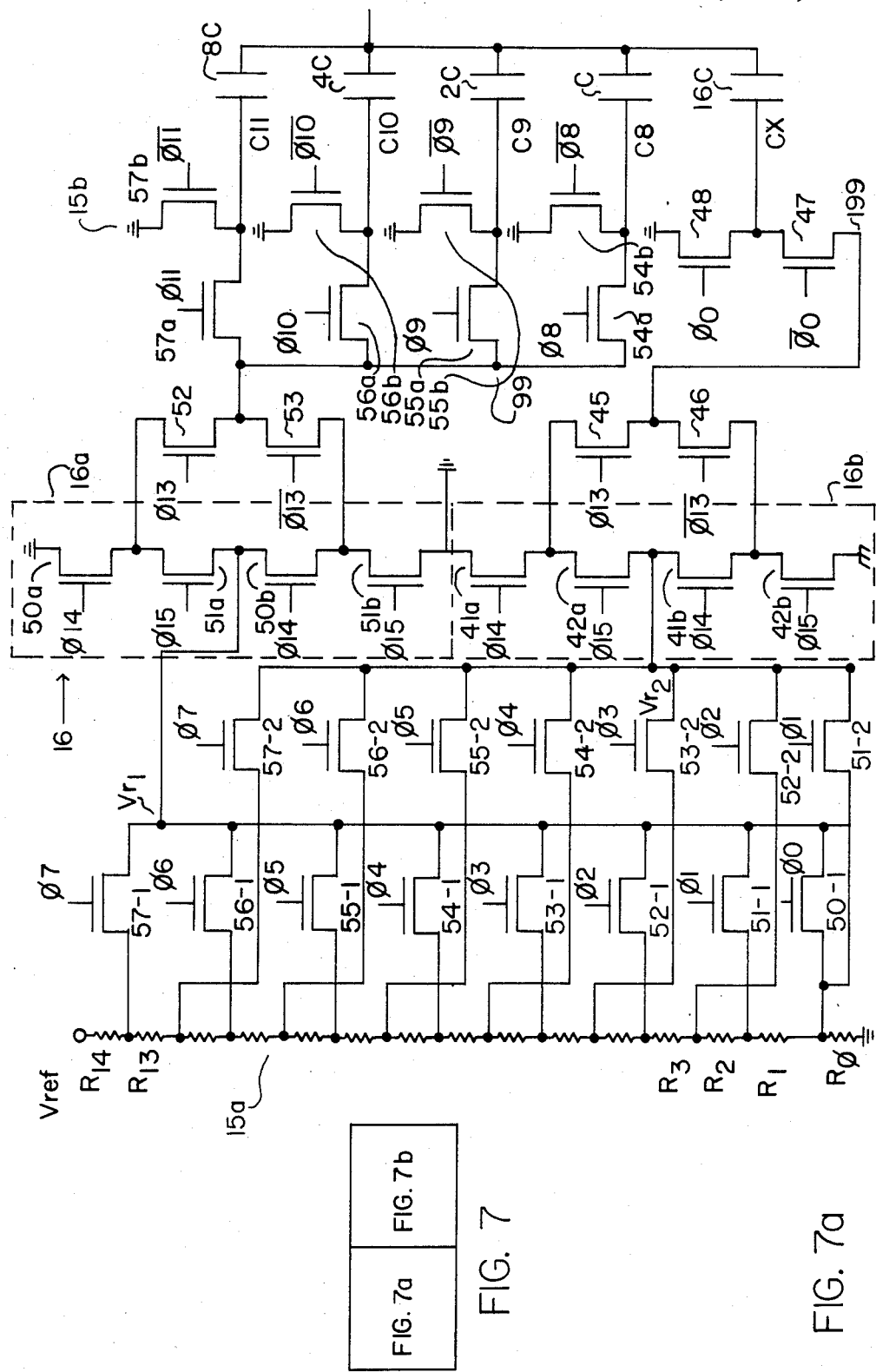
FIGS. 7a and 7b are a schematic diagram of a syllabic filter, polarity switch, integrator and comparator constructed in accordance with the present invention.
FIG. 7 illustrates how FIGS. 7a and 7b fit together to form the schematic diagram.
Figure 7B:
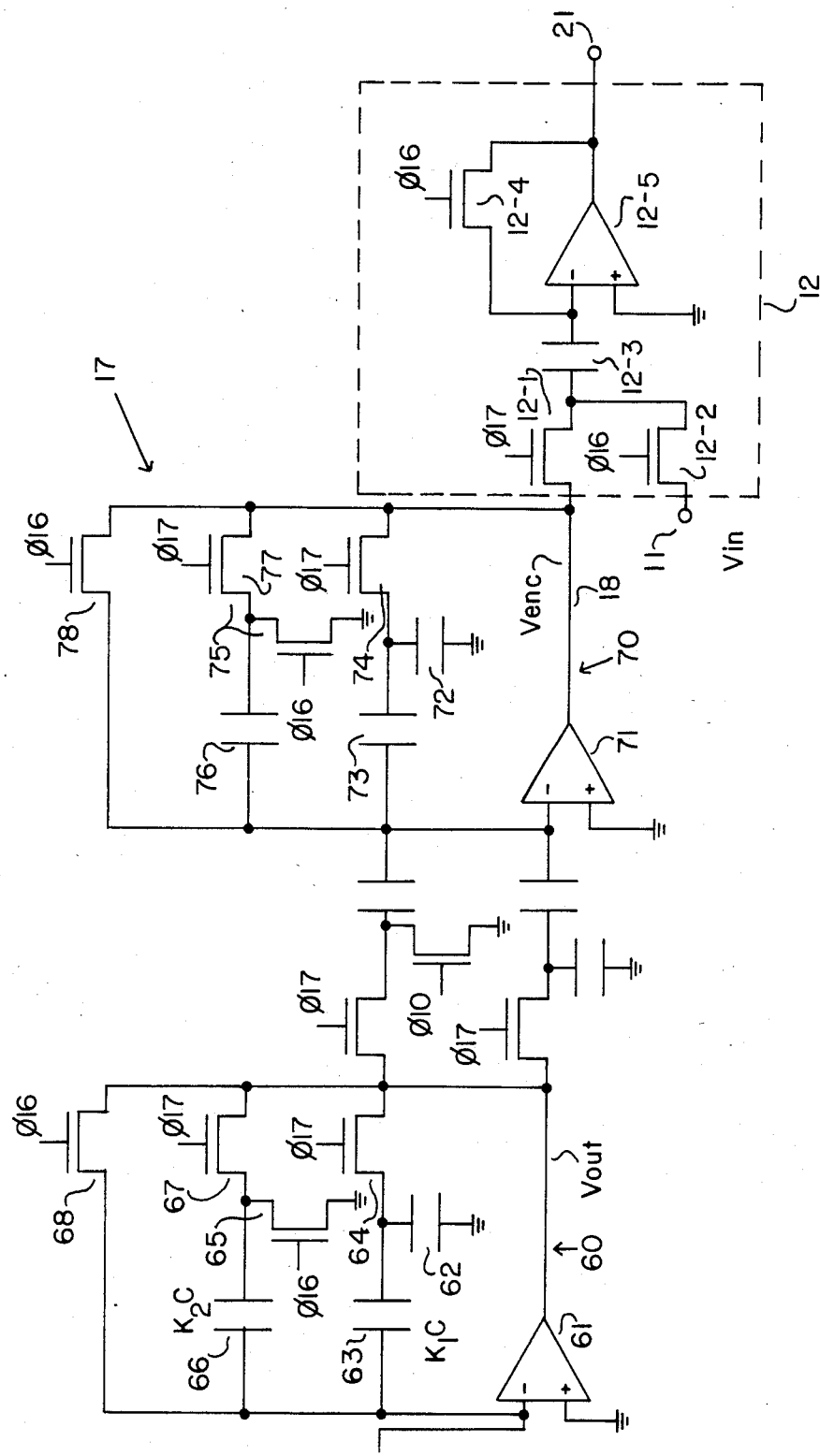
Figure 8:
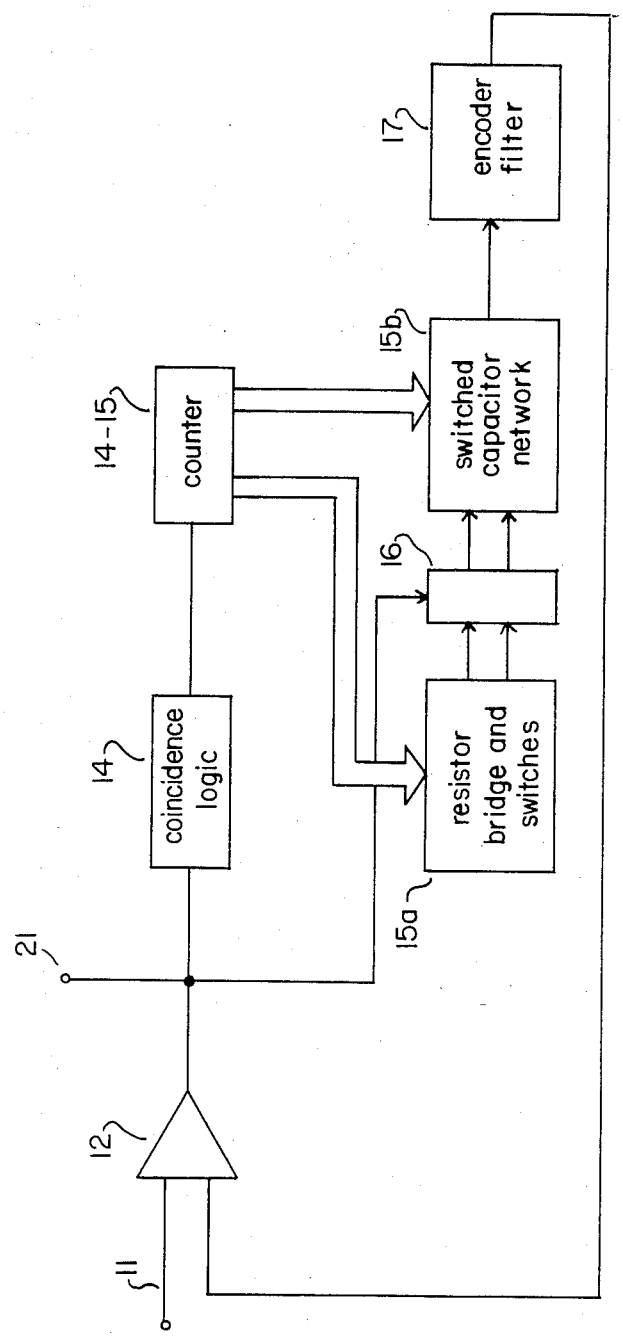
FIG. 8 is a block diagram of the CVSD CODEC constructed in accordance with the present invention.

A detailed schematic diagram of one embodiment coincidence logic 14 and the syllabic filter 15 of this invention is shown in FIGS. 6 and 7. Referring to FIGS. 2 and 6, coincidence logic 14 includes an N bit shift register 14-1 (where N is a selected positive integer), in one embodiment, a four bit shift register. Shift register 14-1 stores a plurality of bits provided on lead 13 from the ouput lead of voltage comparator 12 (FIG. 2) which define the relationship during the previous N sampling periods between the input voltage Vin applied to input terminal 11 and the output voltage Venc from encoder filter 17 available on lead 18. In other words, shift register 14-1 provides an indication of whether each of the past N samples of the output voltage Venc from encoder filter 14 is greater than or less than the past N samples of the input voltage Vin applied to input terminal 11, which is defined by the output sign bit provided by voltage comparator 12 on output terminal 21. When the output voltage Venc from encoder filter 17 is less than the input voltage Vin, the output sign bit from comparator 12 is a logical one. Conversely, when the output voltage Venc from encoder filter 17 is greater than the input voltage Vin applied to terminal 11, the output sign bit from comparator 12 is a logical zero.

"Coincidence" is defined, for the purposes of this patent, as being when each of the plurality of bits stored in the shift register 14-1 of coincidence logic 14, are of equal value. Thus, when a four bit shift register is used in coincidence logic 14, "coincidence" occurs when the four bit shift register 14-1 of coincidence logic 14 stores either four logical zeros, or four logical ones. When shift register 14-1 stores four logical zeros, it indicates that the output voltage from encoder filter 17 is not tracking the input voltage applied to input terminal 11, and in fact the output voltage from encoder filter 14 has been greater than the input voltage on terminal 11 for the past four sampling periods. Conversely, when the four bit shift register 14-1 of coincidence logic 14 stores four logical ones, this indicates that the output voltage from encoder filter 17 is not tracking the input voltage applied to input terminal 11, and in fact that the output voltage from encoder filter 17 has been less than the input voltage applied to terminal 11 during the past four sampling periods.

The logic circuitry provided by NOR gate 14-2 and AND gate 14-3, and OR gate 14-4 provide a logical zero signal on lead 14-4a when coincidence is achieved. With all zeros stored in shift register 14-1, NOR gate 14-2 provides a logical one output signal, thereby generating a logical one output signal on lead 14-4a. Conversely, when all ones are stored in shift register 14-1, AND gate provides a logical one output signal, which in turn cause a logical one to be generated by OR gate 14-4 on lead 14-4a. If shift register 14-1 stores both logical zeros and ones, NOR gate 14-2 and AND gate 14-3 provide logical zeros on their output leads, and OR gate 14-4 provides a logical zero output signal on lead 14-4a, thus indicating that coincidence has not been achieved. When coincidence is achieved, the encoder filter is not tracking the input voltage properly, and accordingly a voltage of greater amplitude must be provided by syllabic filter 15 to encoder filter 17, thereby allowing encoder filter 17 to integrate this voltage and thus cause the output voltage from encoder filter 17 to more quickly move closer to the input voltage Vin, thereby causing the output voltage from encoder filter 17 to better track the input voltage on terminal 11. As previously described, syllabic filter 15 provides a selected one of 128 voltages or "step sizes" to polarity switch 16, and polarity switch 16 applies either the positive or the negative of this output voltage of syllabic filter 15 to encoder filter 17. Thus, polarity switch 16 causes encoder filter 17 to integrate either the positive or the negative value of the output voltage from syllabic filter 15, depending on whether the output voltage from encoder filter 17 is less than or greater than, respectively, the input voltage Vin, as defined by the output sign bit from comparator 12.

When coincidence logic 14 indicates that coincidence has occurred (i.e., the shift register of coincidence logic 14 stores all logical zeros or all logical ones), an up/down 14-5 counter within syllabic filter 15 is caused to count up one count. In one embodiment of this invention, up/down counter 14-5 is a seven bit up/down counter, thereby capable of counting from 0000000 to 1111111, or a total of 128 counts. During each sampling period when coincidence logic 14 indicates that coincidence is not achieved, seven bit up/down counter 14-5 decreases its count by one. As seven bit up/down counter 14-5 increases its count due to coincidence, the output voltage from syllabic filter 15, which is the magnitude of the step size by which encoder filter 17 will integrate, is increased thereby causing encoder filter 17 to provide an output voltage Venc which is closer to the input voltage Vin. Conversely, when coincidence is not detected by coincidence logic 14, the count in seven bit up/down counter 14-5 is decreased, thereby causing the output voltage from syllabic filter 15 to decrease, which in turn causes the output voltage Venc from encoder filter 17 to more accurately track the input voltage Vin utilizing smaller voltage steps. This is necessary because, when coincidence is not detected, the output voltage Venc from encoder filter 17 has not been continuously either greater than or less than the input voltage Vin, and thus is doing a reasonable job in tracking the input voltage Vin. In one embodiment of this invention, coincidence logic 14 includes a rate multiplier, which causes count rate of shift register 14-1 to be increased as coincidence is approached. Thus, in this embodiment of my invention, the count of the shift register 14-1 during each sampling period is not always equal to one, but rather is proportional to the count already stored in the shift register, thereby allowing the step size provided by the encoder filter to be adjusted more quickly to the value required for proper operation of the CVSD CODEC in response to the input signal Vin.

The three most significant bits from seven bit up/down counter 14-5 determine which of the eight segments (FIG. 5) is to be utilized in generating the output voltage or "step size" provided by syllabic filter 15. The four least significant bits of up/down counter 14-5 are used to select which of the 16 steps of the selected segment is to be used. The three most significant bits provided by seven bit up/down counter 14-5 are applied to a well known three to eight decoder in order to provide output signals $\phi_0$ through $\phi_7$, with signal $\phi_0$ corresponding to the three most significant bits of up/down counter 14-5 equal to 000, and $\phi_7$ corresponds to the three most significant bits of up/down counter 14-5 equal to 111. The four least significant bits from seven bit up/down counter 14-5 serve as signals $\phi_8$ through $\phi_{11}$, respectively.

Referring now to FIG. 7, voltage comparator 12 is implemented in one embodiment as an operational amplifier 12-5 utilizing switched capacitor technology and MOS transistors serving as switches. When clock signal $\phi_{16}$ is high (logical "one") switches 12-2 and 12-4 are closed, and switch 12-1 is open. This causes the operational amplifier 12-5 to be placed in the unity gain mode, thus causing the inherent offset voltage Voff of operational amplifier 12-5 to be present on its inverting input lead, and thus on one plate of capacitor 12-3. The input voltage Vin is applied to the other plate of capacitor 12-3, thereby storing a voltage (Vin-Voff) in capacitor 12-3. $\phi_{16}$ then goes low and $\phi_{17}$ goes high, thereby causing switches 12-2 and 12-4 to open and switch 12-1 to close. This causes the output voltage Venc from encoder filter 17 to be applied to one plate of capacitor 12-3, thereby causing capacitor 12-3 to store a voltage equal to (Venc-Voff)−(Vin-Voff)=(Venc-Vin). The output voltage on output terminal 21 is thus either a logical one or a logical zero, depending on whether the output voltage Venc from encoder filter 17 is less than or greater than, respectively, the input voltage Vin. As previously described in conjunction with FIG. 2, this output voltage from comparator 12 serves to control polarity switch 16 and coincidence logic 14.

A resistance ladder formed of resistors R0 through R14 having a plurality of taps located therebetween allows a desired tap to be selected and thus a voltage between Vref and ground to be used to select which segment is to be utilized. The operation of the circuit of FIG. 7a to select the desired segment will be fully described later. In one embodiment of this invention, resistors R0 through R14 are weighted in order to have the following resistance values:

| Resistor | Resistance Value |
|---|---|
| R0 | R |
| R1 | R |
| R2 | R |
| R3 | R |
| R4 | 3R |
| R5 | R |
| R6 | 7R |
| R7 | R |
| R8 | 15R |
| R9 | R |
| R10 | 31R |
| R11 | R |
| R12 | 63R |
| R13 | R |
| R14 | 127R |
| $\sum_{n=0}^{13} Rn$ | 255R |

Two banks of switches (i.e., switches 50-1 through 57-1, and switches 51-2 through 57-2 are used to select desired taps on resistor ladder R0–R13, thereby providing reference voltages Vr1 and Vr2, respectively. As previously described, control signals $\phi_0$ through $\phi_7$ are provided by decoding the three most significant bits from up/down counter 14-5 (FIG. 6). The resistor ladder formed by resistors R0 through R14, switches 50-1 through 57-1, and switches 50-2 through 57-2 form part 15a of syllabic filter 15.

When $\phi_0$ is high, $\phi_1$ through $\phi_7$ are all low, and thus the voltage provided by the tap between resistors R0 and ground is selected as voltage Vr1. Based on the resistance ratios previously described, the voltage on this tap is equal to Vref (R/255R)=Vref/255. Similarly, when $\phi_1$ is high and $\phi_0$, $\phi_2$ through $\phi_7$ are low, the tap between resistors R1 and R2 selected for Vr1, thereby providing a voltage equal to Vref (2R/255R)=2Vref/255, and the tap between resistors R0 and ground selected for Vr2, thereby providing a voltage Vr2 equal to Vref/255. In this manner, the appropriate voltages Vr1 and Vr2 determine which segment is selected.

In another embodiment of this invention, resistor R14 has a resistance value of less than 127R, for example 32R. In this manner, the total resistance of the resistor ladder formed by resistors R0 through R14 is equal to 160R. This causes the voltage at each tap of the resistor ladder to be greater than in the previous embodiment wherein resistor R14 has a resistance value of 127R, thereby allowing the use of a reference voltage Vref whose magnitude is less than the magnitude of the reference voltage Vref required in the previous embodiment, while maintaining the same voltages available on the taps of the resistor ladder formed by resistors R0 through R14.

Polarity switch 16 serves to select whether the selected voltages Vr1 and Vr2 from the resistor ladder provided by resistors R0 through R14 is inverted or not. Thus, for example, if it is desired to integrate on selected capacitors C8 through C11 the negative of the voltage Vr1 provided by the appropriate tap on resistor ladder R0–R14, it is necessary to first integrate the ground voltage, and then integrate the selected voltage from the resistance ladder. This is done by making $\phi_{14}$ high, and $\phi_{15}$ low, thereby turning on switches 50a, 50b, 41a, 41b and turning off switches 51a and 51b. Then, when $\phi_{13}$ goes high and $\overline{\phi_{13}}$ goes low, switch 52 turns on and switch 53 turns off, thereby causing ground voltage to be applied to input bus 99 of syllabic filter 15. Then, when $\phi_{13}$ goes low and $\overline{\phi_{13}}$ goes high, switch 52 turns off and switch 53 turns on, thereby causing the selected voltage from resistor ladder R0 through R13 to be applied to input bus 99 of syllabic filter 15. Similarly, the negative of the voltage Vr2 is integrated on capacitor Cx through bus 199.

Conversely, when it is desired to integrate on selected capacitors C8 through C11 the positive of the voltage Vr1, it is necessary to first sample the voltage Vr1 and then integrate the ground voltage. $\phi_{14}$ is placed low and $\phi_{15}$ is placed high, thereby turning off switches 50a and 50b and turning on switches 51a and 51b. Thus, when $\phi_{13}$ goes high, switch 52 turns on and switch 53 turns off, thereby applying the selected voltage from resistor ladder R0 through R13 to the input bus 99 of syllabic filter 15. Then, when $\phi_{13}$ goes low and $\overline{\phi_{13}}$ goes high, switch 52 turns off and switch 53 turns on, thereby applying the ground voltage to the input bus 99 of syllabic filter 15, as desired. The array of capacitors C8 through C11, capacitor CX, switches 47, 48, 54a through 57a and 54b through 57b form part 15b of syllabic filter 15.

Switched capacitor gain stage 60 serves to select the desired step (FIG. 5). A more detailed description of the operation of a switched capacitor gain stage is described in co-pending U.S. patent application Ser. No. 06/292,870, Filed Aug. 14, 1981 on an invention of Haque, et al., which is assigned to American Microsystems, Inc., the assignee of this invention, and which is hereby incorporated by reference. The design of switched capacitor gain stages 60 and 70 which minimize the effect of the offset voltage of operational amplifiers is disclosed in U.S. patent application Ser. No. 06/287,387 filed July 27, 1981 and assigned to American Microsystems, Inc., and which is hereby incorporated by reference.

The four least significant bits from seven bit up/down counter 14-5 (FIG. 6) of syllabic filter 15 serve to provide signals $\phi_8$ through $\phi_{11}$, which in turn each select and control the operation of an associated one of capacitors C8 through C11, respectively. Capacitors C8 through C11 have capacitance values of C, 2C, 4C, and 8C, respectively. Integrator capacitor 66 has a capacitance of $K_2C$. Thus, the output voltage Vout of switched capacitor gain stage 60, ignoring the effect of capacitor CX, is defined as:

Vout(a)=$(-1^h)(CT/K_2C)$ Vr1 where Vout(a)=the output voltage component of switched capacitor gain stage 15a due to Vr1;

Vr1 = the input voltage provided by switches 50-1 through 57-1 and resistor ladder R0–R14;

CT = the total capacitance of selected capacitors C8 through C11;

$K_2C$ = the capacitance of capacitor 66; and h=1, if polarity switch 16 causes the positive of voltage Vr1 to be integrated by selected capacitors C8 through C11 and h=2 if polarity switch 16 causes the negative of voltage Vr1 to be integrated by selected capacitors C8 through C11.

Capacitor CX, having capacitance value 16C, and polarity switch 16b, switches 47 and 48, and switches 51-2 through 57-2, contribute to the output voltage Vout from operational amplifier 61 is defined as follows:

$$\text{Vout}(b) = (-1^h)(16C/K_2C) Vr2$$

where Vout(b)=the output voltage component of switched capacitor gain stage 60 due to Vr2;

Vr2=The input voltage provided by switches 51-2 through 57-2 and resistor ladder R0–R14;

16C=the capacitance of capacitor Cx;

h=1, if polarity switch causes the positive of voltage Vr2 to be integrated by capacitor Cx and h2 if polarity switch 16 causes the negative of voltage Vr2 to the integrated by capacitor Cx.

The output voltage Vout from switched capacitor gain stage 60 is equal to $$Vout = Vout(a) + Vout(b)$$
$$= (-1^h)[(CT/K_2C) Vr1 + (16C/K_2C) Vr2]$$

Switched capacitor gain stage 70, which is identical in operation with switched capacitor gain stage 60, serves to amplify the output signal Vout from switched capacitor gain stage 60 and provide an encoder filter output voltage Venc an output lead 18 of switched capacitor gain stage 70. This output voltage Venc is in turn applied to one input lead of comparator 12. Comparator 12 serves to provide an output signal on output terminal 21 indicating whether the input voltage Vin is greater than or less than the encoder filter output voltage Venc. As previously described, this output signal on terminal 21 is applied to coincidence logic 14 (FIGS. 2 and 6) and polarity switch 16 (FIGS. 2 and 7a), thereby providing proper operation of the CVSD CODEC constructed in accordance with this invention.

In accordance with this invention, capacitors C8 through C11 and CX serve both as the weighting capacitors to provide the appropriate step size, and the input capacitor of switched capacitor gain stage 60, thereby eliminating the need for an additional input capacitor and appropriate switches for sampling the input voltage applied to operational amplifier 61. The elimination of this extra input capacitor saves valuable area on an integrated circuit device, when the CVSD CODEC of this invention is formed as a monolithic integrated circuit. Furthermore, the elimination of the additional input capacitor and associated switches minimizes offset voltages, thereby making the CVSD CODEC of this invention more accurate.

The specific embodiments of this invention described in this specification are intended to serve by way of example and are not a limitation on the scope of my invention. Numerous other embodiments of this invention will become apparent to those of ordinary skill in the art in light of the teachings of this specification.

I claim:

1. A Coder-Decoder comprising:

an input terminal for receiving an input signal to be converted;

a comparator having a first input lead connected to said input terminal, a second input lead, and an output lead, said comparator providing a binary digit output signal;

an encoder filter for providing an encoder filter output voltage having an input lead and an output lead connected to said second input lead of said comparator;

coincidence logic for providing a coincidence signal when said binary digit output signal from said comparator has been a logical one or a logical zero during each of the previous N sample periods, where N is a selected positive integer;

a syllabic filter means responsive to said coincidence logic, said syllabic filter means providing a syllabic filter output signal having a magnitude proportional to the number of preceding sample periods in which said coincidence signal is present; and polarity switch means responsive to said binary digit output signal, said polarity switch means connecting the positive value of said syllabic filter output signal to said encoder filter when said binary digit output signal is of a first binary value, and the negative value of said syllabic filter output signal when said binary digit output signal is of a second binary value opposite said first binary value;

and wherein said coincidence logic comprises:

an N bit shift register for storing the values of said binary digit output signal during N sample periods;

logical means for providing a coincidence signal when the N bits stored in said shift register are either all logical ones or all logical zeros;

an M bit up/down counter, where M is a selected integer, the contents of said counter incrementing when said coincidence signal is present and decrementing when said coincidence signal is not present; and means for providing the P most significant bits and the Q least significant bits from said up/down counter to said syllabic filter, where P and Q are selected positive integers such that P+Q=M;

and wherein said syllabic filter comprises:

means for generating a reference voltage proportional to said P most significant bits;

a switched capacitor gain stage; and means for controlling the gain of said switched capacitor gain stage proportional to said Q least significant bits.

2. A circuit comprising:

an input terminal for receiving an input signal;

a comparator having a first input lead connected to said input terminal, a second input lead, and an output lead, said comparator providing a binary digit output signal;

coincidence logic for providing a coincidence signal in response to said binary digit output signal being a logical one during each of the previous N sample periods or said binary digit output signal being a logical zero during each of the previous N sample periods, where N is a selected positive integer;

a counter coupled to said coincidence logic, the contents of said counter incrementing in response to said coincidence signal, the contents of said counter decrementing in response to the absence of said coincidence signal, said counter providing an output count indicative of the contents of said counter;

voltage means for providing a voltage on a voltage output lead in response to said count; and first means for integrating said voltage on said voltage output lead, said first means having an output lead coupled to said second input lead of said comparator.

3. The circuit of claim 2 wherein said voltage means comprises:
providing means having a plurality of output leads, said providing means driving each of said output leads with a voltage; and
a plurality of switches, each switch having a first lead uniquely coupled to one of said providing means output leads, each switch having a second lead coupled to said voltage output lead, said switches opening and closing in response to the contents of said counter.

4. The circuit of claim 2 wherein said voltage means comprises:
a first terminal for receiving a first voltage;
a second terminal for receiving a second voltage;
a series of serially connected resistors coupled between said first and second terminals, said series of resistors forming a voltage divider network;
first switch means for coupling a first node within said voltage divider network to said voltage output lead in response to said output count; and
second switch means for coupling a second node within said voltage divider network to said voltage output lead in response to said output count.

5. The circuit of claim 4 wherein said first means comprises:
a switched capacitor circuit, said switched capacitor circuit including a plurality of input capacitors, each of said input capacitors having a first lead coupled to a common node, each of said capacitors having a second lead;
a plurality of switches, each switch having a first lead coupled to a second lead of one of said capacitors, each of said switches having a second lead coupled to said voltage output lead, the state of said switches being responsive to said output count;
an operational amplifier having a first input lead coupled to a reference voltage, a second input lead coupled to said common node, and an output lead;
a feedback capacitor; and
a feedback switch, the series combination of said feedback capacitor and said feedback switch being coupled across said output lead of said operational amplifier and said second input lead of said operational amplifier.

6. A circuit comprising:
an input terminal for receiving an input signal;
a comparator having a first input lead connected to said input terminal, a second input lead, and an output lead, said comparator providing binary digit output signal;
coincidence logic for providing a coincidence signal in response to said binary digit output signal being a logical one during each of the previous N sample periods or said binary digit output signal being a logical zero during each of the previous N sample periods, where N is a selected positive integer;
a counter coupled to said coincidence logic, the contents of said counter incrementing in response to said coincidence signal, the contents of said counter decrementing in response to the absence of said coincidence signal, said counter providing an output count indicative of the contents of said counter;
means for driving a first terminal with a voltage;
a plurality of switches, each switch having a first lead coupled to said first terminal, each switch having a second lead, said switches opening and closing in response to the contents of said counter;
a plurality of capacitors, each capacitor having a first lead coupled to a unique one of said switches, each capacitor having a second lead coupled to a common node;
an operational amplifier having a first input lead coupled to a reference voltage, a second input lead coupled to said common node, and an output lead coupled to said second lead of said comparator;
a feedback capacitor; and
a feedback switch, the series combination of said feedback capacitor and said feedback switch coupled between said output lead of said operational amplifier and said second input lead of said operational amplifier.

* * * * *